United States Patent [19]

Lapadula et al.

[11] 4,211,834

[45] Jul. 8, 1980

[54] METHOD OF USING A O-QUINONE DIAZIDE SENSITIZED PHENOL-FORMALDEHYDE RESIST AS A DEEP ULTRAVIOLET LIGHT EXPOSURE MASK

[75] Inventors: Constantino Lapadula, Mahopac; Burn J. Lin, Katonah, both of N.Y.

[73] Assignee: International Business Machines Corporation, Armonk, N.Y.

[21] Appl. No.: 866,191

[22] Filed: Dec. 30, 1977

[51] Int. Cl.$^2$ .................................................. G03C 5/16
[52] U.S. Cl. ......................................... 430/326; 430/5; 430/142; 430/192; 430/296
[58] Field of Search ............. 96/36, 36.2, 38.3, 115 R, 96/91 D, 27 R; 427/43

[56] References Cited

U.S. PATENT DOCUMENTS

| | | | |
|---|---|---|---|
| T900,009 | 7/1972 | Dunham | 96/115 R |
| 3,403,024 | 9/1968 | Luce | 96/36 |
| 3,639,185 | 2/1972 | Colom et al. | 96/91 D X |
| 3,647,438 | 3/1972 | Helman | 96/116 X |
| 3,661,582 | 5/1972 | Broyde | 96/36 X |
| 3,666,473 | 5/1972 | Colom et al. | 96/91 D |
| 3,759,711 | 9/1973 | Rauner et al. | 96/91 D |
| 4,004,925 | 1/1977 | Van Besauw et al. | 96/38.3 |
| 4,022,932 | 5/1977 | Feng | 427/43 |
| 4,078,098 | 3/1978 | Cortellino | 427/43 |

OTHER PUBLICATIONS

Lin, B. J., "Deep UV Lithography," *J. Vac. Sci. Tech.,* vol. 12, No. 6, pp. 1317–1320, (1975).
Dr. W. Summer, "Ultra-Violet and Infra-Red Engineering," Sir Isaac Pitman & Sons Ltd., 1962, pp. 61 and 287.

*Primary Examiner*—Charles L. Bowers, Jr.
*Attorney, Agent, or Firm*—Ronald L. Drumheller

[57] ABSTRACT

A photolithographic method wherein a mask is made by pattern exposing and developing a o-quinone diazide sensitized phenol-formaldehyde resist layer, the formed resist mask then being used directly as an exposure mask for a layer of deep ultraviolet (less than 3000Å) sensitive resist such as an alkyl methacrylate resist.

Since alkyl methacrylate resists are not sensitive to light above 3000Å and phenol-formaldehyde resists are opaque to light below 3000Å, phenol-formaldehyde resists may be used directly as photoexposure masks for alkyl methacrylate resists using any broad band exposure light source which includes deep ultraviolet. The direct use of a phenol-formaldehyde resist layer as an exposure mask for an alkyl methacrylate resist layer allows more flexible and practical use of resist exposure techniques, including fabrication of an etch resistant mask of high aspect ratio and high resolution without fabrication of an intermediate metallic mask from a material such as chromium.

21 Claims, 7 Drawing Figures

METHOD OF USING A O-QUINONE DIAZIDE SENSITIZED PHENOL-FORMALDEHYDE RESIST AS A DEEP ULTRAVIOLET LIGHT EXPOSURE MASK

BACKGROUND OF THE INVENTION

1. Field of the Invention

This invention relates to methods of fabricating etch resistant masks and more particularly relates to a method of directly using a first exposed resist layer as a photoexposure mask for a second resist layer. Such etch resistant layer are useful in the manufacture of integrated circuits and other microminiature electronic components.

2. Description of the Prior Art

Etch resistant masks are commonly fabricated in the manufacture of integrated circuits and other microminiature electronic components. In this fabrication process a radiation sensitive layer of resist material is coated on a substrate and patternwise exposed to actinic radiation such as visible or ultraviolet light, x-rays, nuclear radiation or electrons. The irradiated regions of the resist layer suffer a chemical change which makes them either more soluble (positive resist) or less soluble (negative resist) than the non-irradiated regions. A developer is then used to preferentially remove the more soluble regions, which are the irradiated regions in a positive resist and the non-irradiated regions in a negative resist. The substrate may then be subjected to a selective processing step through the openings or windows in the resulting mask, for example by etching or deposition.

Because the size of semiconductor devices is a factor in the ultimate speed of integrated circuits as well as in the initial and operational cost thereof, intensive efforts are being made to reduce the size of individual components and to increase the packing density of integrated components. Size reduction is limited, however, by the accuracy with which etch resistant masks can be fabricated and positioned. Because certain processing steps such as electroplating, reactive ion etching and lift-off require a relatively thick mask, the limiting factors in a multilevel fabrication process often are the resolution and aspect ratio (thickness of mask divided by the minimum practical linewidth at that thickness) which can be achieved during fabrication of thick etch resistant masks. Resolution and aspect ratio are limited in part by the choices of resist material and actinic radiation and in part by the type and resolution of the exposure system.

O-quinone diazide sensitized phenol-formaldehyde resist is a postive resist in common use today and is composed of a base soluble polymer such as phenol-formaldehyde novalak resin and a photoactive compound such as naphthoquinone-(1,2)-diazide sulfonic acid ester sensitizer. Such resists and sensitizers are described, for example, in U.S. Pat. Nos. 3,046,118; 3,046,121; 3,106,465; 3,201,239; 3,666,473 and 4,007,047 which are hereby incorporated by reference. O-quinone diazide sensitized phenol-formaldehyde resists have high sensitivity and submicron resolution when the resist layer thickness is sufficiently small that diffraction and absorption effects do not limit resolution. Thick resist layers of this type (greater than one micron) have a low aspect ratio and a much reduced resolution due to optical diffraction and absorption effects.

When pattern exposure of a photoresist, such as a O-quinone diazide sensitized phenol-formaldehyde resist, is done by optical projection, depth of field will also limit resolution and aspect ratio unless the photoresist layer is thin. While it is possible to avoid the depth of field problem by forming a narrow photon beam and computer controlling it to directly write a pattern onto a resist layer, this is generally not practical becuase it involves precision manipulation of an optical lens system, which is very slow and impractical. It is practical to use an electron beam in place of the photon beam but resolution is then limited instead by scattering effects. Exposure by contact printing also avoids the depth of field problem but it involves other disadvantages. Contact printing tends to scratch masks, so that contact masks have a short life and should be more durable than masks fabricated for projection printing. Proximity printing rather than contact printing extends the life of the mask but diffraction effects are worse. Diffraction effects may be reduced somewhat by reducing the wavelength of the exposure light but this type of improvement is ultimately limited by the light sensitivity and absorption characteristics of the resist. Because of these problems it has not been practical generally to fabricate high resolution thick masks from diazo sensitized phenol-formaldehyde.

Another type of positive resist in common use today is composed of certain radiation degradable alkyl methacrylate polymers. Such resists and their use are described for example in U.S. Pat. Nos. 3,538,137; 3,934,057 and 3,984,582 which are hereby incorporated by reference. Alkyl methacrylate polymers such as polymethyl methacrylate and copolymers of methyl methacrylate and polymethyl methacrylate are typically patternwise exposed by forming a narrow beam of electrons and computer controlling the beam to directly write a desired pattern onto the layer. The resolution of such a resist system is not limited by diffraction effects and direct writing speed capability is sufficiently high to be practical. In thin layers a resolution of a fraction of a micron is feasible with present technology. However, an electron beam inherently scatters or spreads in a thick layer of such radiation degradable polymers so that a low aspect ratio results. While 0.5 micron resolution is possible with a 0.25 micron thick layer of such material, resolution already drops to about one micron when the layer is 0.4 micron thick.

Alkyl methacrylate polymers are degradable with other high energy radiation as well. X-ray radiation in the 5Å to 50Å range produces a particularly sharp edge and very high aspect ratio is possible with this type of radiation. However, computer controlled direct writing with x-ray radiation is not practical with current technology and projection printing with x-ray radiation is not technically feasible. Contact printing and proximity printing can be done with x-ray radiation but good materials for fabricating suitable masks are not available. A gold pattern on mylar has been used for x-ray contact printing but it is difficult to form a thin layer of mylar which is uniform and defect free. Thin mylar sheets are also stretchable which makes dimensional control a further problem.

Alkyl methacrylate polymer resist layers may also be selectively degraded by patterned exposure to deep ultraviolet light of wavelength less than 3000Å. Direct writing is again not practical while projection exposure limits resolution in thick layers due to depth of field limitations. Contact exposure masks may be formed of chromium but thin chromium layers are difficult to form uniformly without creating pinholes. In addition, chromium layers cannot be stripped from a substrate without damaging the substrate. While contact masks of chromium are reasonably durable (for a contact mask that is) fabrication thereof requires several steps, including the fabrication of an etch resistant mask on top of the chromium layer. Such complexity is justified only where the mask will be used a large number of times. Chromium masks also produce a further difficulty due to the optical opacity of such masks, namely that such masks are inherently more difficult to align properly than an optically transparent mask such as iron oxide. Semitransparent masks employing a silver halide emulsion cannot be used because of low resolution due to the large grain of the image. Semitransparent diazo dye masks are not practical because they are very difficult to form properly and are not easily stripped. Furthermore the optical performance of such masks is unknown in the deep ultraviolet range.

It is an object of the present invention to provide a practical method for fabricating a thick etch resistant mask with high aspect ratio and resolution.

A further object is to avoid the use in such a method of an opaque contact mask which is difficult to align.

Another object is to reduce the number and complexity of the steps in such a fabrication process.

A still further object is to provide a practical method for fabricating a thick etch resistant mask having high aspect ratio and resolution when very few or only one such mask is to be made.

It is also an object of this invention to fabricate a thick etch resistant mask having high aspect ratio and resolution without forming an in contact mask of chromium.

Another object is to employ projection printing for resist exposure without having the ultimate aspect ratio and resolution limited by the depth of field of the projection printing system.

A still further object of the present invention is to use an optical resist exposure system while reducing diffraction effect upon ultimate aspect ratio and resolution.

BRIEF SUMMARY OF THE INVENTION

The above objects have been achieved quite simply by using O-quinone diazide sensitized phenol-formaldehyde resist directly as a photoexposure mask. It has been discovered that this commonly used type of resist material is opaque below 3000A, which conveniently covers the range of optical sensitivity of another commonly used resist material, namely alkyl methacrylate polymer. Therefore a broad spectral range light source which includes deep ultraviolet light may now be used to pattern expose a deep ultraviolet sensitive resist such as alkyl methacrylate polymer through a developed mask of O-quinone diazide sensitized phenol-formaldehyde resist. The phenol-formaldehyde resist layer may be made suitably thin to avoid resolution limiting effects arising from light diffraction of depth of field while the alkyl methacrylate resist may be made sufficiently thick to perform desired processing steps which require thick resist layers and high aspect ratio losing the high resolution achieved with the thin phenol-formaldehyde resist and without forming an intermediate mask of another material such as chromium.

The foregoing and other objects, features and advantages of the invention will be apparent from the following more particular description of preferred embodiments of the invention.

DESCRIPTION OF THE PREFERRED EMBODIMENTS

Figure 1A:
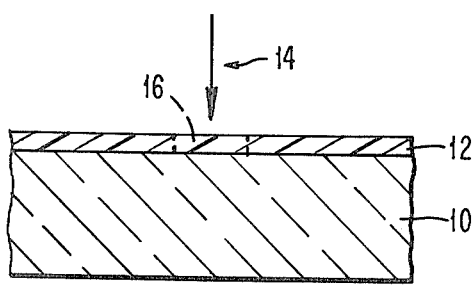
FIGS. 1A, 1B and 1C are fragmentary cross-sectional views of different exposure methods for forming a diazo sensitized phenol-formaldehyde resist mask suitable for subsequent use as a photoexposure mask in accordance with the present invention.
Figure 1C:
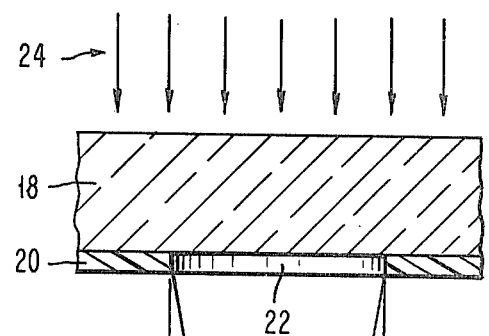
Figure 1B:
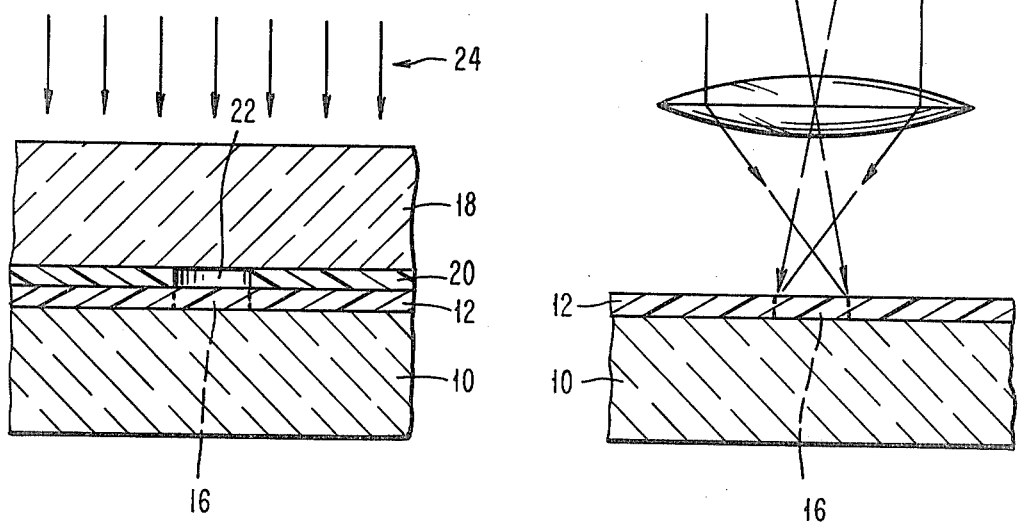

Referring now to the drawings, FIGS. 1A, 1B and 1C illustrate three different ways of pattern exposing a O-quinone diazide sensitized phenol-formaldehyde resist layer 12. Layer 12 has been deposited on substrate 10 by any known method such as by dipping, coating or spinning. As will become more apparent, substrate 10 must be capable of transmitting deep ultraviolet light. Quartz is a suitable material for this purpose. Resist layer 12 may be formed of any of the commercially available positive resists composed of an alkali soluble phenol-formaldehyde novolak resin and a photoactive compound containing diazo and keto groups at adjacent positions on the molecule. Examples of such resins and sensitizers are described in the above-referenced patents. A suitable phenol-formaldehyde is m-cresol formaldehyde and a suitable sensitizer is a naphthoquinone-(1,2)-diazide sulfonic acid ester. Such resists are available from Shipley, for example, as AZ-1350, AZ-1350B, AZ-1350H, AZ-1350H, AZ-2400 and AZ-111. Kodak 809, Polychrome Pc-129 and Nagase KTI are believed to be of the same type.

Phenol-formaldehyde resist layer 12 may be pattern exposed by any known method such as by computer controlled direct writing of a small beam of photons or electrons 14 (FIG. 1A), or by flooding with actinic radiation 24 a contact mask 20 supported by a transparent substrate 18 (FIG. 1B) and having a relief image 22. Projection printing (FIG. 1C) with either reflected or transmittal light may also be used in place of contact printing (FIG. 1B). By any of these methods resist layer 12 is exposed in desired areas (schematically represented here by region 16) and then developed in an alkaline developer solution to preferentially remove those areas, thereby forming a relief image (schematically represented by aperture 17).

Figure 2:
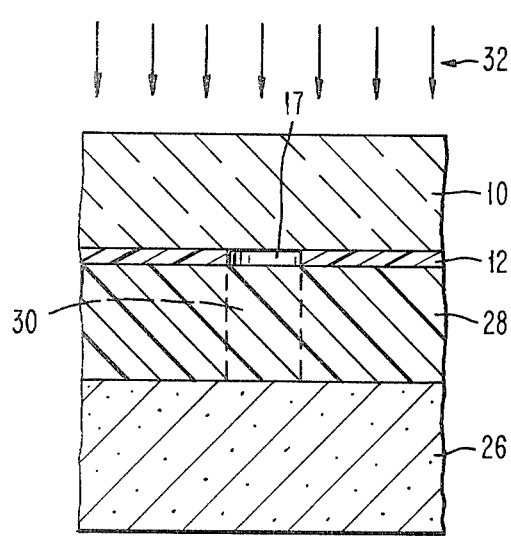
FIG. 2 is a fragmentary cross-sectional view of a developed phenol-formaldehyde mask being used as a contact mask to pattern expose a deep ultraviolet light sensitive resist layer in accordance with this invention.

The resulting phenol-formaldehyde mask is then used to expose another resist layer 28 (FIG. 2). Resist layer 28 may be composed of any deep ultraviolet sensitive resist such as a lower alkyl ester of methacrylic acid such as polymethyl methacrylate or a copolymer of methyl methacrylate and polymethyl methacrylate. Certain O-quinone diazide sensitized phenol-formaldehyde resists are also sensitive to deep ultraviolet light, such as Shipley AZ-2400. Resist layer 28 is supplied to a substrate 26 which requires an etch resistant mask for a processing step. The mask 12 is used to patternwise expose layer 28 to deep ultraviolet light. Preferably mask 12 is used either as a contact mask (FIG. 1B) or as a proximity mask (FIG. 3A) but it may also be used with projection printing (FIG. 1C) if sufficient depth of field can be obtained and if the optical system transmits deep ultraviolet light. If mask 12 is used in reflective mode for projection printing, a reflective layer such a aluminum or chromium must be used between the resist and the mask substrate.

It has been discovered that a O-quinone diazide sensitized phenol-formaldehyde resist layer such as layer 12 is effectively opaque to light to wavelength below about 3000Å while an alkyl methacrylate resist layer such as layer 28 is sensitive only to light of wavelength below about 2600Å. Thus, when layer 28 is composed of alkyl methacrylate, flood light 32 may be any light source having as a component ultraviolet light below about 2600Å. Light above 3000Å which penetrates through the mask material of mask 12 does not effect layer 28 if it is only sensitive below 3000Å as is alkyl methacrylate. Since Shipley AZ-2400 is also sensitive above 3000Å, light source 32 may not contain an actinic component above 3000Å when this type of resist is used for layer 28. Light below 2000Å is absorbed by air, but light may be transmitted in vacuum to as low as 1000Å. Vacuum ultraviolet sources are readily available but exposure of the alkyl methacrylate in this region must be done in vacuum. Furthermore, since quartz absorbs light below about 1800Å, exposure in the vacuum ultraviolet range generally requires use of the alternative method illustrated in FIGS. 3A, 3B and 3C which does not require a substrate for the phenol-formaldehyde resist layer. After layer 28 has been pattern exposed through mask 12, it is developed to produce an etch resistant mask on substrate 26. Layer 12 should be suitably thin to maximize resolution which layer 28 may have whatever thickness is required by subsequent processing.

Figure 3A:
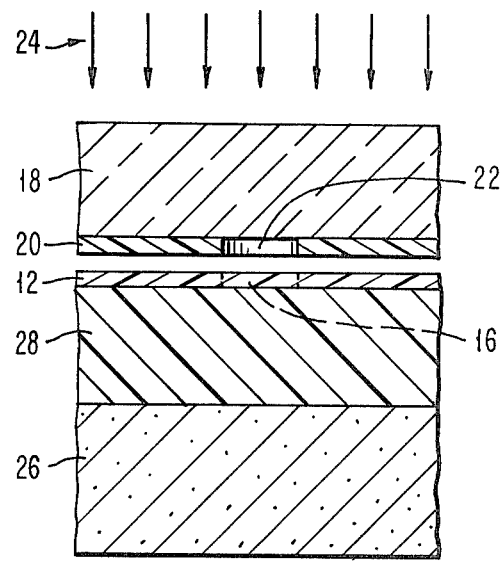
FIGS. 3A, 3B and 3C are fragmentary cross-sectional views of various stages of an alternative embodiment of this invention in which the phenol-formaldehyde mask has been fabricated on top of a deep ultraviolet light sensitive resist layer.
Figure 3B:
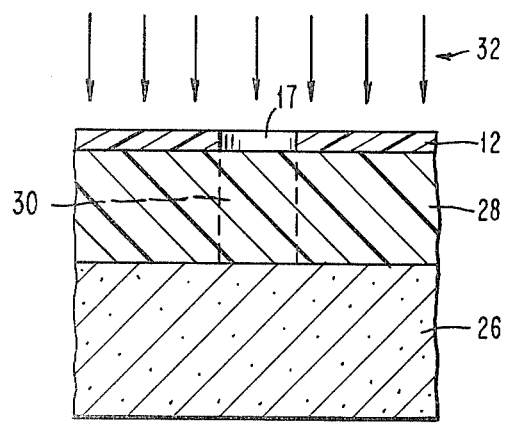
Figure 3C:
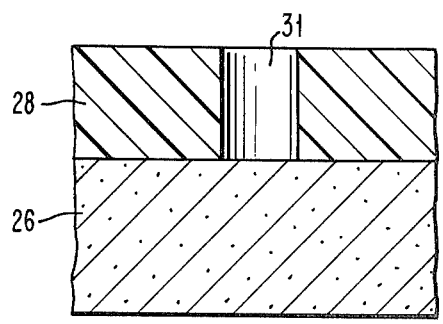

An alternative method in accordance with this invention is illustrated in FIGS. 3A, 3B and 3C. In this embodiment the O-quinone diazide sensitized phenol-formaldehyde resist layer 12 is deposited directly upon the deep ultraviolet sensitive layer 28 (FIG. 3A). The resist layer 12 is then patternwise exposed by any suitable method (a proximity mask is used in FIG. 3A) followed by development and then a blanket exposure with light 32 containing deep ultraviolet components. A portion 30 thus become exposed and is later devaloped away (FIG. 3C) leaving aperture 31. Resist layer 12 may or may not be removed in the final development step.

EXPERIMENT I

A 0.2 micron thick layer of Shipley AZ-1350J resist was coated on a quartz substrate and then patternwise exposed to a chromium mask pattern having a range of linewidths using contact printing (FIG. 1B) and a xenonmercury arc light source. The resist layer was subsequently developed in Shipley AZ-1350J developer to form a mask having clean and vertical 0.5 micron lines. PMMA (polymethyl methacrylate) resist, Dupont Elvacite 2041, was then coated on another substrate to a thickness of 1.6 microns and brought into contact with the mask as shown in FIG. 2. The mask was then flooded with light from the xenon-mercury arc lamp and the PMMA layer developed in methyl isobutyl ketone. Clean vertical sidewalls resulted in the 1.6 micron PMMA with 0.5 micron resolution.

EXPERIMENT II

In this experiment the AZ resist was directly coated onto the PMMA resist as illustrated in FIG. 3A and flood light from a deuterium lamp was used to expose the PMMA layer. Other conditions were the same as in Experiment I and the results were similar. Clean vertical side walls were produced in 1.6 micron PMMA with 0.5 micron resolution.

EXPERIMENT III

In this case the AZ resist was coated to a thickness of 0.8 micron. Otherwise, the conditions were the same as in Experiment II except that chlorobenzene was used for developing the PMMA layer. Due to the difference in developer, the AZ mask was not dissolved away in this case although it was dissolved away in Experiment II. Half micron lines in the 0.8 micron AZ resist showed an overcut side profile. However, these lines developed clean vertical side walls in the PMMA layer.

While the invention has been particularly shown and described with reference to preferred embodiments thereof, it will be understood by those skilled in the art that changes in form and details may be made therein without departing from the spirit and scope of the invention.

What is claimed is:

1. A photolithographic method, comprising the steps of:
   forming a positive-acting relief image mask from o-quinone diazide sensitized phenol-formaldehyde resist material;
   flooding said relief image mask with light having wavelength components below about 3000Å and possibly also having wavelength components above about 3000Å;
   imaging transmitted light from said flooded relief image mask onto a layer of photosensitive resist material which is sensitive to actinic light below about 3000Å and, when said flooding light has components above about 3000Å, said imaged layer of photosensitive resist material being insensitive to said components above about 3000Å; and
   removing with a preferential solvent the portions of said layer which have been exposed to said actinic light below about 3000Å.

2. A photolithographic method as defined in claim 1 wherein said layer of resist material consists essentially of an alkyl methacrylate resist.

3. A photolithographic method as defined in claim 2 wherein said alkyl methacrylate resist comprises polymethyl methacrylate.

4. A photolithographic method as defined in claim 2 wherein said alkyl methacrylate resist consists essentially of polymethyl methacrylate.

5. A photolithographic method as defined in claim 4 wherein said flooding light has a wavelength component within the range of 2000Å to 2600Å.

6. A photolithographic method, comprising the steps of:
   imagewise exposing to actinic radiation a first layer of resist material consisting essentially of an alkali soluble phenol-formaldehyde resin and naphthoquinone-(1,2)-diazide sulfonic acid ester sensitizer;
   developing a relief image of resist by removing the exposed portions of said first layer with an alkaline developer solution;
   flooding said relief image of resist with light having wavelength components below about 3000Å and possibly also having wavelength compents above about 3000Å;

imaging transmitted light from said flooded relief image of resist onto a second layer of photosensitive resist material which is sensitive to actinic light below about 3000Å and, when said flooding light has components above about 3000Å, said imaged layer of photosensitive resist material being insensitive to said components above about 3000Å; and removing with a preferential solvent the portions of said second layer which have been exposed to said actinic light below about 3000Å.

7. A photolithographic method as defined in claim 6 wherein said second layer of resist material consists essentially of an alkyl methacrylate resist.

8. A photolithographic method as defined in claim 7 wherein said alkyl methacrylate resist consists essentially of polymethyl methacrylate.

9. A photolithographic method as defined in claim 8 wherein said flooding light has a wavelength component within the range of 2000Å and 2600Å.

10. A photolithographic method as defined in claim 6 wherein said phenol-formaldehyde resin consists essentially of a cresol-formaldehyde novolak resin.

11. A photolithographic method as defined in claim 10 wherein said sensitizer consists essentially of the 1-oxo-2-diazo-naphthalene-5-sulfonic acid ester of 2,3,4-trihydroxybenzophenone.

12. A photolithographic method as defined in claim 6 wherein said actinic radiation to which said just layer is imagewise exposed is light having wavelength components within the range of about 3000Å to about 4500Å.

13. A photolithographic method as defined in claim 6 wherein said actinic radiation to which said first layer is imagewise exposed is electron beam radiation.

14. A photolithographic method as defined in claim 6 wherein said imagewise exposing of said first layer is done by computer controlling a thin beam of actinic radiation.

15. A photolithographic method as defined in claim 6 wherein said imagewise exposing of said first layer is done by printing an image from an exposure mask with actinic light using a method selected from the group consisting of contact printing, proximity printing, projection printing with mask transmitted light and projection printing with mask reflected light.

16. A photolithographic method as defined in claim 6 wherein said flooding light contains wavelength components above 3000Å to which said relief image of resist is substantially transparent.

17. A photolithographic method as defined in claim 6 wherein said flooding light is light originating from either a xenon mercury arc lamp or a deuterium lamp.

18. A photolithographic method as defined in claim 6 wherein said imaging of transmitted light from said flooded relief image of resist is done by using a method selected from the group consisting of contact printing, proximity printing and projection printing.

19. A photolithographic method as defined in claim 6 wherein said first and second layers are supported by separate substrates.

20. A photolithographic method as defined in claim 6 wherein said first and second layers are formed in contact with each other.

21. A photolithographic method as defined in claim 6 wherein said second layer of resist material is also sensitive to light above 3000Å but said flooding light does not contain components above 3000Å to which said second layer is sensitive.

* * * * *